United States Patent [19]

Ramaswami et al.

[11] Patent Number: 5,451,545
[45] Date of Patent: Sep. 19, 1995

[54] PROCESS FOR FORMING STABLE LOCAL INTERCONNECT/ACTIVE AREA SILICIDE STRUCTURE VLSI APPLICATIONS

[75] Inventors: Seshadri Ramaswami, San Jose; Robin W. Cheung, Cupertino, both of Calif.

[73] Assignee: Advanced Micro Devices, Inc., Sunnyvale, Calif.

[21] Appl. No.: 309,692

[22] Filed: Sep. 21, 1994

Related U.S. Application Data

[62] Division of Ser. No. 995,869, Dec. 23, 1992, Pat. No. 5,365,111.

[51] Int. Cl.⁶ .......................................... H01L 21/283
[52] U.S. Cl. ............................. 437/200; 437/190; 437/192; 437/247; 748/DIG. 1; 748/DIG. 19
[58] Field of Search ............... 437/190, 192, 195, 200, 437/193, 247; 257/768; 748/DIG. 19, DIG. 15; 148/DIG. 1

[56] References Cited

U.S. PATENT DOCUMENTS

| | | | |
|---|---|---|---|
| 3,381,182 | 4/1968 | Thornton et al. | 257/770 |
| 4,680,612 | 7/1987 | Hieber et al. | 257/751 |
| 4,873,204 | 10/1989 | Wong et al. | 437/200 |
| 4,937,652 | 6/1990 | Okumura et al. | 257/763 |
| 4,962,414 | 10/1990 | Liou et al. | 257/751 |
| 4,994,402 | 2/1991 | Chiu | 437/41 |
| 5,049,975 | 9/1991 | Ajika et al. | 257/763 |
| 5,173,450 | 12/1992 | Wei | 437/200 |
| 5,187,122 | 2/1993 | Bonis | 437/200 |
| 5,326,724 | 7/1994 | Wei | 437/200 |

Primary Examiner—T. N. Quach
Attorney, Agent, or Firm—Benman Collins & Sawyer

[57] ABSTRACT

A local interconnect silicide structure (30) for connecting silicon regions (16) to silicon regions (20) separated by oxide regions (24) comprises a first portion of titanium silicide/titanium nitride/titanium silicide contacting the silicon regions and a second portion of titanium/titanium nitride/titanium silicide contacting the oxide regions. The silicide structure is also useful for connecting source/drain regions (14) and polysilicon interconnects (28). Two separate heating steps are employed, separated by an etch step to form the interconnects (34, 36). The first heating step forms (a) titanium silicides with single or polycrystalline silicon, using a first titanium layer (30a) at the bottom of the silicide structure and (b) titanium silicides with amorphous silicon (30d), using a second titanium layer (30c) on top of the titanium nitride layer (30b) on which the amorphous silicon is deposited and then patterned. The second heating step, which is at a higher temperature than the first, converts all the titanium silicides to titanium disilicide.

5 Claims, 3 Drawing Sheets

PROCESS FOR FORMING STABLE LOCAL INTERCONNECT/ACTIVE AREA SILICIDE STRUCTURE VLSI APPLICATIONS

This is a division of application Ser. No. 07/995,869 filed Dec. 23, 1992, now U.S. Pat. No. 5,365,111.

TECHNICAL FIELD

The present invention relates to semiconductor processing, and, more particularly, to stable interconnects for very large scale integration (VLSI) technology.

BACKGROUND ART

Local interconnect structures have been proposed by many technologists as a low resistance "short" interconnect for signals. The resistance is typically about 1 to 10 ohms/sq. The most common proposed structures have been Ti/TiN and Ti/Si structures. The Ti/TiN suffers in performance because it is at the high end of the resistance specification. The Ti/Si structure has the right resistance of <3 ohms/sq, but the problem is that the stoichiometry is very critical. It appears a ratio of between 0.1 to 0.4 for Ti to Si is desirable. Any ratio outside of the range will cause peeling.

An added problem for the Ti/Si structure is that in most applications, it is required that three different types of silicide be formed at the same time; namely, silicide on polycrystalline films, silicide on single crystalline, and silicide on amorphous films. The simultaneous optimization of (a) deposition of Ti:Si and (b) formation of these three levels of silicide is close to impossible for all practical purposes. A side effect of the inability for the simultaneous optimization is that the silicide film(s) will delaminate from the underlying layer due to intrinsic stress problems of the silicide. The incorporation of other foreign elements such as oxygen exacerbates the problem by impeding the silicidation reaction and increasing the intrinsic stress.

Therefore, a new interconnect structure is required to provide applicable solutions. The invention disclosed herein provides that solution.

DISCLOSURE OF INVENTION

In accordance with the invention, a local interconnect silicide structure for connecting silicon regions to silicon regions separated by oxide regions comprises a first portion of titanium silicide/titanium nitride/titanium silicide contacting the silicon regions and a second portion of titanium/titanium nitride/titanium silicide contacting the oxide regions. The silicon regions may be any combination of single crystalline, polycrystalline, or amorphous.

The local interconnect silicide structure is formed by a process comprising:

(a) forming a stack layer comprising a first layer of titanium on the silicon and oxide regions, a layer of titanium nitride on the layer of titanium, a second layer of titanium on the layer of titanium nitride, and a layer of amorphous silicon on the second layer of titanium;

(b) patterning the layer of amorphous silicon;

(c) heating the stack layer at a first temperature to form titanium silicide wherever the first layer of titanium contacts the silicon regions and wherever there remains amorphous silicon on the second layer of titanium;

(d) wet etching the stack layer to remove metalization to form patterned interconnects; and (e) heating the stack layer at a second temperature above the first temperature to convert all silicide to disilicide.

The interconnect silicide structure of the present invention forms a silicide with all silicon regions (doped source and drain regions in the silicon substrate, polysilicon gate electrodes, and polysilicon interconnects). The silicide structure of the present invention also forms a silicide between the second titanium layer and the top amorphous silicon layer in the stack layer. Where the titanium/titanium nitride layer contacts an oxide, such as an oxide spacer or field oxide, it provides a barrier layer and an adhesion layer, and prevents peeling. It further prevents oxidation of the upper titanium silicide layer by oxygen diffusing from the underlying oxide, during the heat treatment associated with the silicide formation and subsequent processing steps.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

BEST MODES FOR CARRYING OUT THE INVENTION

Reference is now made in detail to a specific embodiment of the present invention, which illustrates the best mode presently contemplated by the inventors for practicing the invention. Alternative embodiments are also briefly described as applicable.

First, a silicon wafer is processed employing conventional CMOS technology for isolation and gate poly definitions. An insulating spacer technology is required for the gate structure. This provides the required isolation of source-drain silicide to that of the polysilicon gate silicide. After the spacer formation, P+ and N+ junctions are formed by conventional methods.

Figure 1:
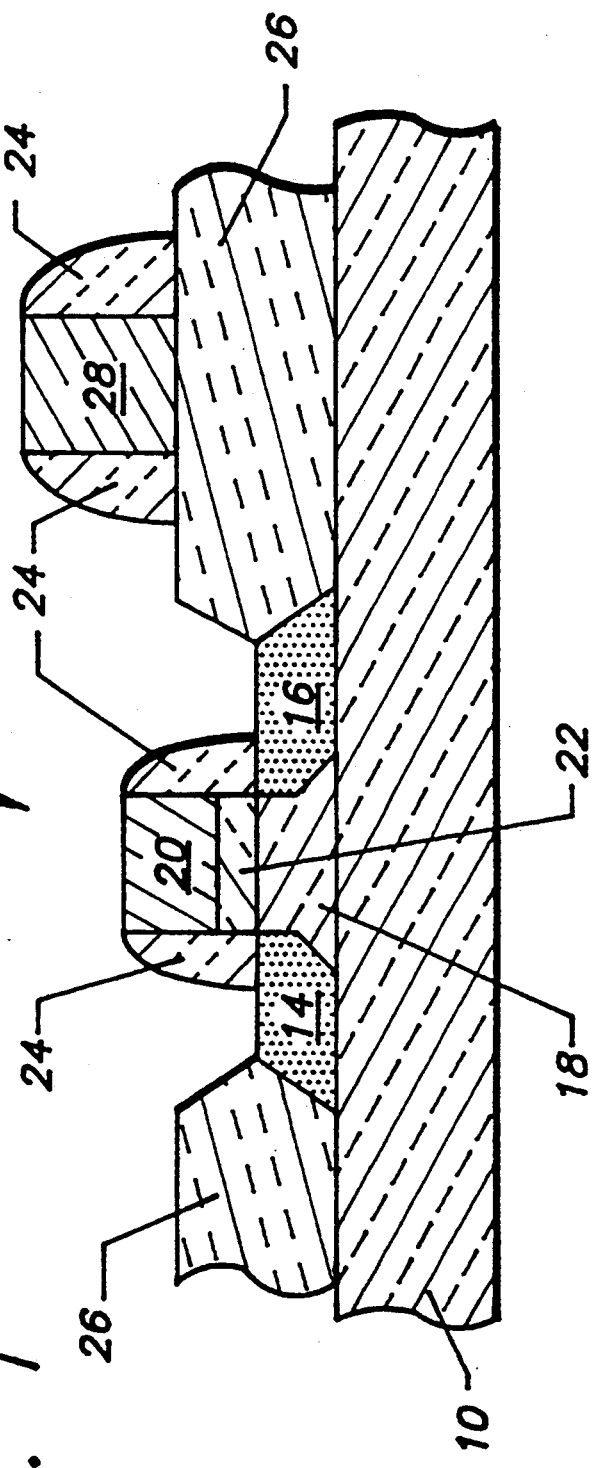
FIGS. 1-3 are cross-sectional views depicting the process of the invention and the resulting structure.

Shown in FIG. 1 is a cross-sectional view of a wafer comprising a silicon substrate 10 on which is formed a plurality of CMOS devices 12. Source and drain regions 14, 16 are depicted, separated by a channel region 18. The channel region 18 is separated from a gate electrode 20 formed over gate oxide 22. An oxide spacer 24 is formed on the sides of the gate electrode 20 to electrically isolate the gate electrode from source and drain contacts and/or interconnects (not shown in FIG. 1, but depicted in FIG. 3). A field oxide 26 separates one MOS device 12 from neighboring devices. An interconnect 28 is shown formed on the surface of the field oxide 26, again with oxide spacers 24 on the sides thereof. The interconnect 28 is for connecting one device 12 to another. The formation of the source/drain regions and gate oxides and electrodes and interconnects is conventional to this point of the processing and forms no part of the present invention.

In accordance with the invention, a composite layer comprising a layer 30a of Ti and a layer 30b of TiN is blanket-deposited over the surface of the silicon substrate. The Ti/TiN structure can either be physically sputtered by reactive techniques or by CVD methods. The thickness of the Ti layer 30a should be in the range of about 250 to 600 Å. The actual thickness is determined by the desired junction depth and resistivity of the silicide films to be subsequently deposited (described below). The TiN layer 30b serves as a conducting barrier and its thickness should be in the range of about 350 to 800 Å. The exact thickness is determined by step coverage and film stress considerations. This Ti/TiN film also serves to act as a barrier between the oxide region in the field and subsequent silicide film depositions. Such subsequent silicide film depositions may be made via CVD titanium-silicide or PVD (physical vapor deposition), e.g., sputtering, of titanium and silicon.

Then another layer 30c of Ti is blanket-deposited, followed by deposition of a layer 30d of amorphous Si thereon. Typically, the Ti and Si layers 30c and 30d, respectively, are physically sputtered in a conventional physical vapor deposition (PVD) apparatus. Plasma-enhanced Si deposition is also acceptable. Even with the advent of CVD TiSi$_2$ technology, the underlying Ti/TiN layers, provided in accordance with the present invention, would still be required.

The ratio of Ti and Si in layers 30c and 30d is determined by the resistance requirements. A typical thickness for the Ti layer 30c is in the range of about 300 to 1,000 Å. The thickness of the Si layer 30d is at least about 2 times that of Ti layer 30c.

Figure 2:
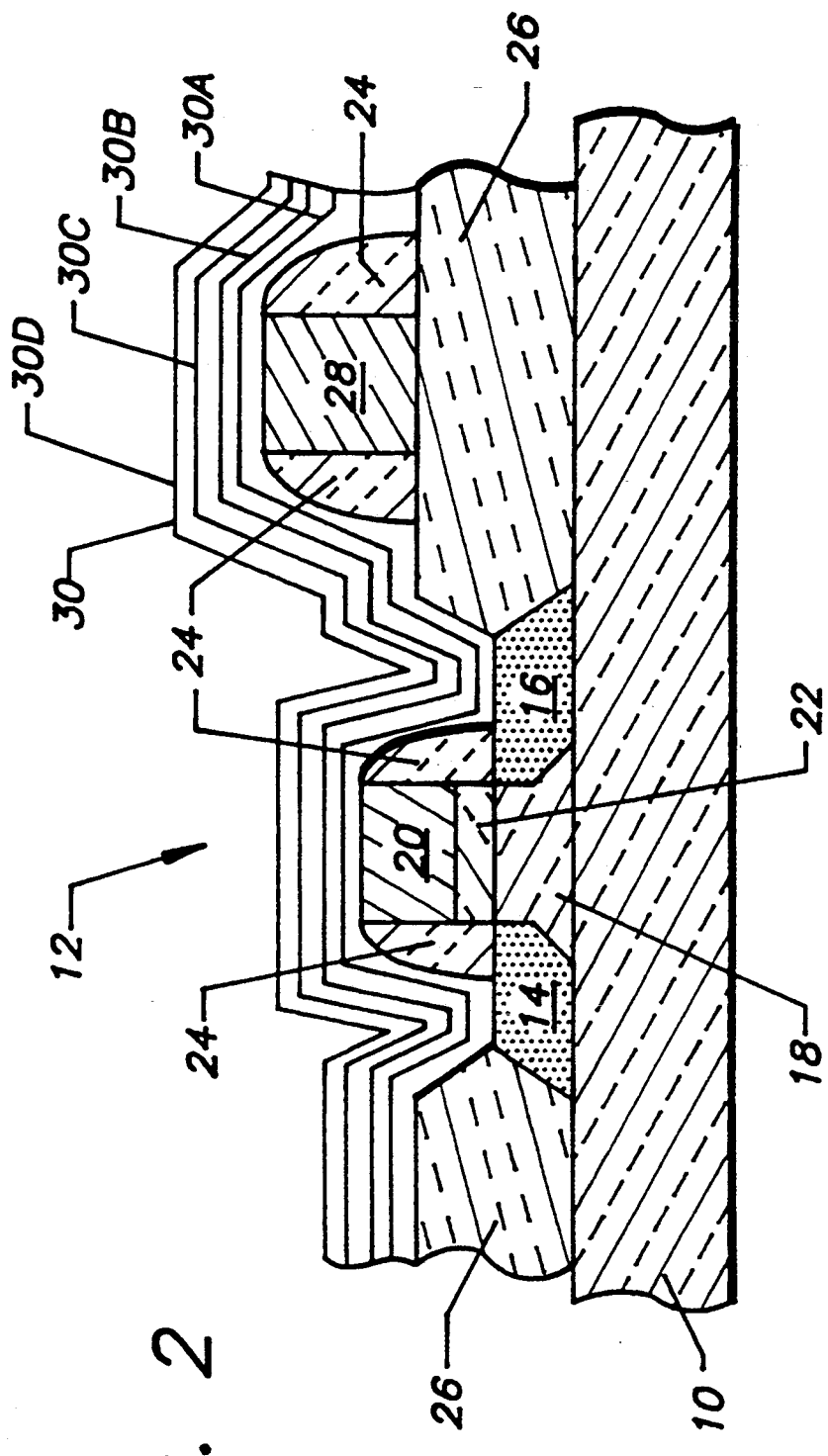

The resulting Ti/TiN/Ti/Si composite layer 30 is shown in FIG. 2. The total Ti/TiN/Ti/Si composite layer 30 ranges from about 1,500 to 5,000 Å in thickness.

A masking (not shown) is performed to define the local interconnect features. Reactive ion etch (RIE) is performed employing conventional etchants, such as fluorine-containing chemistry, and the etch should stop on the second Ti layer 30c. This establishes the amorphous silicon as a template for subsequent etching (described below) to define the interconnects.

Rapid thermal annealing (RTA) is carried out at a temperature in the range of 350° to 675° C. for a period of time ranging from about 30 to 90 seconds. The RTA process causes a reaction between the silicon and titanium to form titanium silicides. Specifically, where the first titanium layer 30a contacts silicon, whether single crystal or polycrystal, titanium silicides are formed. Where regions of amorphous silicon 30d remain on the second titanium layer 30c, again, titanium silicides are formed.

The temperature and time requirements given above are determined by the resistance requirements and the local interconnect spacing design rules as well as the poly to poly design rules. Typically for lower resistance, a higher annealing temperature and longer time is required. For smaller spacing, a lower temperature and less time is more appropriate. Since silicon is the diffusing species, higher temperatures and/or longer times will cause silicon to diffuse into the "spaces" (not yet defined by the subsequent etching step to define interconnects) and thereby form undesired interconnects.

Next, the wafer is subjected to a NH$_4$OH-based wet solution. The temperature of etching is determined by the desired etch rate and the rate of undercut. A typical temperature would be about 20° to 40° C. The wet etch removes all the unreacted Ti and TiN on the wafer surface, leaving the desired patterned interconnects. After this process step, only the silicide local interconnect and the silicided gate poly and junctions remain.

Figure 3:
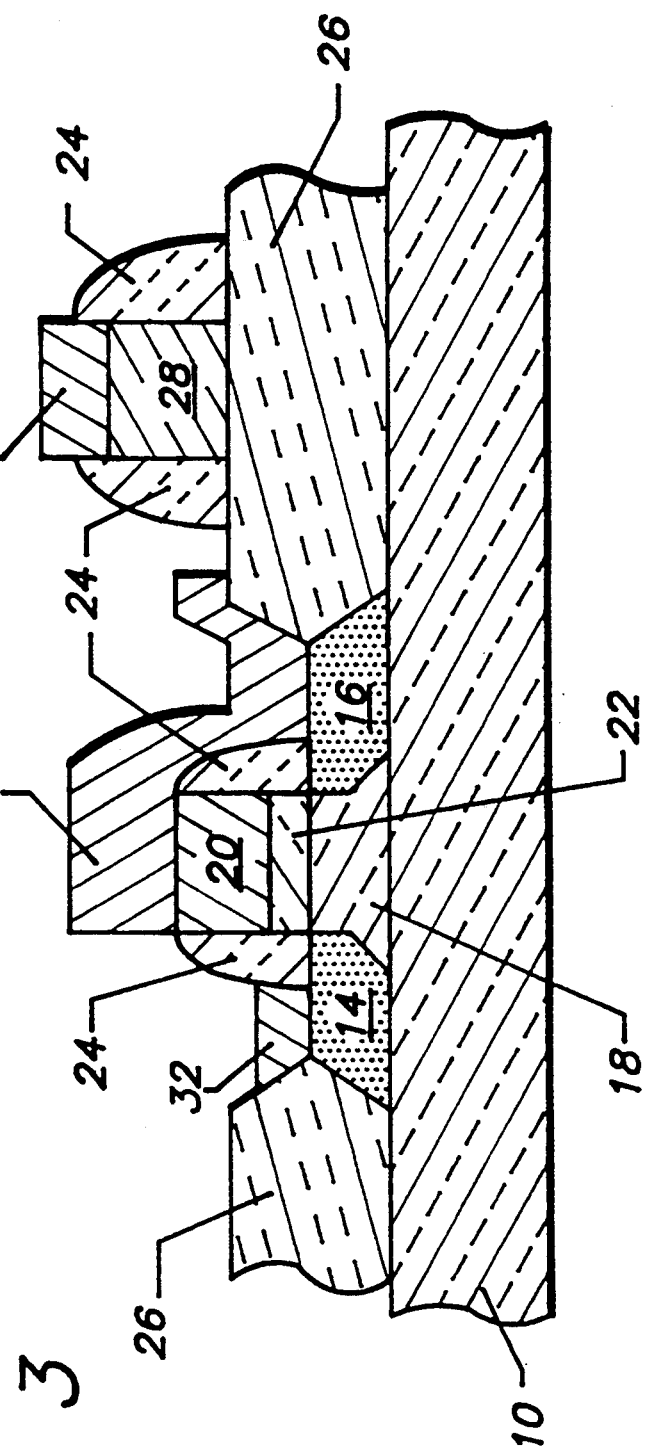

Specifically, silicided source/drain contact 32 to source/drain region 14, local interconnect 34 between drain/source region 16 and gate polysilicon 20, and silicided polysilicon contact 36 remain, as shown in FIG. 3. Thus, it can be appreciated that where the Ti/TiN/Ti/Si structure 30 contacts silicon, as is the case with source/drain regions 14, 16 (silicon substrate), gate polysilicon 20, and interconnect polysilicon 28, a titanium silicide is formed, using the first titanium layer. However, where the Ti/TiN/Ti/Si structure 30 forms an interconnect between two such silicon areas and crosses an oxide, as is the case with the local interconnect 34 crossing oxide 24, then Ti is in contact with the oxide surface. This combination of Ti/TiN prevents peeling (delamination) and serves as a diffusion barrier. Further, over the oxide surface, it prevents oxidation of the upper titanium silicide (formed by the second titanium layer and silicon) by oxygen from the oxide layer.

A higher temperature heat treatment, ranging from about 600° to 800° C. for a period of time ranging from about 15 to 60 seconds, is next performed in addition to the first heat treatment. The second heat treatment serves to convert all TiSi in the stack layer 30 to its most stable form, the disilicide.

Once this is done, the wafer is ready to be processed by conventional back end of the line technology to form the completed devices.

It will be appreciated that the first heat treatment must be done at a temperature sufficiently low so as to prevent undesirable diffusion of silicon, while at the same time forming titanium silicides. The second heat treatment then converts all the silicides to the disilicide form.

A series of wafers were processed as follows, employing as the bottom titanium layer a titanium layer of about 300 Å. The titanium nitride layer was 800 Å. The thickness of the second titanium layer varied as indicated in the Table below. The silicon layer was 1,000 Å. All thickness values were within ±15%. RTA was performed at 650° C. for 60 sec.

TABLE

Results of Processing.

| Example | Thickness of 2nd Ti | Results | Peeling Test |
|---|---|---|---|
| 1 | 600 Å | Dull purple center spot 3" dia.; blue 1" ring outside center spot; metallic grey ring around edge | No peeling at 5 spots around the edge and the center spot |
| 2 | 500 Å | Dull purple center spot 5" dia.; blue ½" ring outside center spot; metallic grey ring around edge | No peeling at 5 spots around the edge and the center spot |
| 3 | 400 Å | Light blue center spot 4½" dia.; dull purple ring around edge | No peeling at 5 spots around the edge and the center spot |
| 4 | 350 Å | Uniform light blue all over | No peeling at 5 spots around the edge and the center spot |
| 5 | 250 Å | Uniform light blue all over | No peeling at 5 spots around the edge and the center spot |

The following comments are made with respect to the Table. First, no peeling was observed for any of the titanium (second layer) thicknesses. This is in contrast to earlier experiments which showed delamination where there was no Ti/TiN underlayer for all thicknesses of the second Ti layer. Second, Ti also reduced SiO$_2$ at temperatures above 700° C. and formed a good bond thereto. Third, the TiSi$_2$ on the oxide regions was stoichiometric and free of oxygen impurities. Stress in the silicided layer 30 was also controlled.

INDUSTRIAL APPLICABILITY

The stable local interconnect silicide structure of the invention is expected to find use in very large scale integration.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A process for forming local interconnect silicide structures for connecting silicon regions to silicon regions separated by oxide regions on a semiconductor wafer, comprising:

(a) forming a stack layer comprising a first layer of titanium on said silicon and said oxide regions, a layer of titanium nitride on said first layer of titanium, a second layer of titanium on said layer of titanium nitride, and a layer of amorphous silicon on said second layer of titanium;

(b) patterning and etching said layer of amorphous silicon to define said local interconnect silicide structures;

(c) heating said stack layer at a first temperature to form titanium silicide wherever said first layer of titanium contacts said silicon regions and wherever there remains amorphous silicon on said second layer of titanium;

(d) wet etching said stack layer to remove any unreacted titanium and titanium nitride remaining on said semiconductor wafer to form said local interconnect silicide structures; and (e) heating said stack layer at a second temperature above said first temperature to convert all titanium silicide in said stack layer that was formed in step (c) to titanium disilicide.

2. The process of claim 1 wherein said first layer of titanium ranges from about 250 to 600 Å, said layer of titanium nitride ranges from about 350 to 800 Å thick, said second layer of titanium ranges from about 300 to 1,000 Å, and said layer of silicon has a thickness of about 2 times that of said second layer of titanium.

3. The process of claim 1 wherein said stack layer is heated in step (c) to a temperature of about 350° to 650° C. for a period of time ranging from about 30 to 90 seconds.

4. The process of claim 1 wherein said etching in step (d) comprises subjecting said semiconductor wafer to an ammonium ion-containing solution to remove any unreacted titanium and titanium nitride remaining on said semiconductor wafer.

5. The process of claim 1 wherein said stack layer is heated in step (e) to a temperature of about 600° to 800° C. for a period of time ranging from about 15 to 60 seconds.

* * * * *